(12) United States Patent
Terakawa

(10) Patent No.: US 7,804,024 B2
(45) Date of Patent: Sep. 28, 2010

(54) PHOTOVOLTAIC DEVICE AND METHOD OF MANUFACTURING THE SAME

(75) Inventor: Akira Terakawa, Nara (JP)

(73) Assignee: Sanyo Electric Co., Ltd., Osaka (JP)

( * ) Notice: Subject to any disclaimer, the term of this patent is extended or adjusted under 35 U.S.C. 154(b) by 190 days.

(21) Appl. No.: 12/051,534

(22) Filed: Mar. 19, 2008

(65) Prior Publication Data

US 2008/0230122 A1    Sep. 25, 2008

(30) Foreign Application Priority Data

Mar. 19, 2007  (JP) .............................. 2007-071033
Feb. 12, 2008  (JP) .............................. 2008-030373

(51) Int. Cl.
*H01L 33/00* (2010.01)

(52) U.S. Cl. .................. 136/256; 136/258; 136/261; 428/527

(58) Field of Classification Search ............... 136/258, 136/256, 261; 257/52; 428/527
See application file for complete search history.

(56) References Cited

U.S. PATENT DOCUMENTS

2003/0168660 A1 * 9/2003 Terakawa et al. ............ 257/52

FOREIGN PATENT DOCUMENTS

JP         2004-221142         8/2004

OTHER PUBLICATIONS

Viernow et al. "Regular step arrays on silicon", Applied Physics Letters, vol. 72 (8) p. 948-950.*
Maruyama JP2004-221142, Aug. 2004, Machine Translation.*
T.H. Wang, et al., "Effect of emitter deposition temperature on surface passivation in hot-wire chemical vapor deposited silicon heterojunction solar cells," Thin Solid Films, 2006, pp. 284-287, vol. 501.
Hiroyuki Fujiwara, et al., "Impact of epitaxial growth at the heterointerface of a-Si:H/c-Si solar cells," Applied Physics Letters, 2007, vol. 90, 013503-1, American Institute of Physics.

* cited by examiner

*Primary Examiner*—Jeffrey T Barton
*Assistant Examiner*—Devina Pillay
(74) *Attorney, Agent, or Firm*—Ditthavong, Mori & Steiner, P.C.

(57) ABSTRACT

A photovoltaic device capable of improving an output characteristic is obtained. This photovoltaic device includes a first conductivity type crystalline silicon region, a second conductivity type first noncrystalline silicon layer and a substantially intrinsic second noncrystalline silicon layer arranged between the crystalline silicon region and the first noncrystalline silicon layer, and the crystalline silicon region has an aperiodic corrugated shape having a height of not more than 2 nm on the interface between the same and the second noncrystalline silicon layer.

20 Claims, 2 Drawing Sheets

PYRAMIDAL Si IRREGULARITIES

PHOTOVOLTAIC DEVICE AND METHOD OF MANUFACTURING THE SAME

BACKGROUND OF THE INVENTION

1. Field of the Invention

The present invention relates to a photovoltaic device and a method of manufacturing the same, and more particularly, it relates to a photovoltaic device comprising a first conductivity type crystalline silicon region, a second conductivity type first noncrystalline silicon layer and a substantially intrinsic second noncrystalline silicon layer arranged between the crystalline silicon region and the first noncrystalline silicon layer and a method of manufacturing the same.

2. Description of the Background Art

A photovoltaic device comprising a p-type single-crystalline silicon substrate (crystalline silicon region), an n-type amorphous silicon layer (first noncrystalline silicon layer) and a substantially intrinsic i-type amorphous silicon layer (second noncrystalline silicon layer) is known in general, as disclosed in T. H. Wang, E. Iwaniczko, M. R. Page, D. H. Levi, Y. Yan, H. M. Branz and Q. Wang, "Effect of Emitter Deposition Temperature on Surface Passivation in Hot-Wire Chemical Vapor Deposited Silicon Heterojunction Solar Cells", Thin Solid Films, 501 (2006), pp. 284 to 287, for example.

The aforementioned literature of H. Wang et al. discloses that an epitaxial layer having a corrugated shape is formed on the surface of the p-type single-crystalline silicon substrate on the interface between the p-type single-crystalline silicon substrate and the i-type amorphous silicon layer by epitaxial growth when the i-type amorphous silicon layer is formed on the p-type single-crystalline silicon substrate. This literature also describes that the output characteristic of the photovoltaic device is reduced when this epitaxial layer remarkably grows, due to deterioration of an interfacial characteristic. The aforementioned literature of H. Wang et al. proposes a technique of preventing the p-type single-crystalline silicon substrate from formation of a crystalline silicon layer (epitaxial layer) resulting from epitaxial growth by reducing the substrate temperature when forming the i-type amorphous silicon layer on the p-type single-crystalline silicon substrate, in order to suppress such reduction in the output characteristic of the photovoltaic device. In other words, the i-type amorphous silicon layer is formed on the p-type single-crystalline silicon substrate without formation of an epitaxial layer in the aforementioned structure proposed by T. H. Wang et al.

SUMMARY OF THE INVENTION

An object of the present invention is to provide a photovoltaic device capable of improving an output characteristic and a method of manufacturing the same.

A photovoltaic device according to a first aspect of the present invention comprises a first conductivity type crystalline silicon region, a second conductivity type first noncrystalline silicon layer and a substantially intrinsic second noncrystalline silicon layer arranged between the crystalline silicon region and the first noncrystalline silicon layer, while the crystalline silicon region has an aperiodic corrugated shape having a height of not more than 2 nm on the interface between the crystalline silicon region and the second noncrystalline silicon layer. In the present invention, the term "crystalline silicon region" is a wide concept including a crystalline silicon substrate or a thin-film polycrystalline silicon layer formed on a substrate. In the present invention, further, the term "first noncrystalline silicon layer" and the "second noncrystalline silicon layer" are wide concepts including not only amorphous silicon layers but also microcrystalline silicon layers.

In the photovoltaic device according to the first aspect, as hereinabove described, the aperiodic corrugated shape having the height of not more than 2 nm is formed on the interface between the crystalline silicon region and the second noncrystalline silicon layer, whereby the output characteristic of the photovoltaic device can be improved as compared with a case where the height of the aperiodic corrugated shape is larger than 2 nm and a case where no aperiodic corrugated shape is formed. This effect has already been demonstrated by an experiment described later.

In the aforementioned structure, the aperiodic corrugated shape of the crystalline silicon region may have a height of not more than 1 nm.

In the aforementioned structure, an average plane of the interface between the crystalline silicon region having the aperiodic corrugated shape and the second noncrystalline silicon layer may be inclined by a prescribed angle from the (111) plane of the crystalline silicon region.

In the aforementioned structure, the average plane is inclined by 3±1° from the (111) plane of the crystalline silicon region.

In the aforementioned structure, the crystalline silicon region may include a crystalline silicon substrate provided with a plurality of terraces exposing (111) planes on the surfaces thereof and a step connecting adjacent terraces with each other and an epitaxial layer epitaxially grown on the crystalline silicon substrate, and the average plane may be inclined by the prescribed angle from the (111) plane of the crystalline silicon region in a rotational direction from the surfaces of the terraces of the crystalline silicon substrate exposing the (111) planes toward the outer surface of the step.

In the aforementioned structure, a portion of the crystalline silicon region close to the interface between the crystalline silicon region and the second noncrystalline silicon layer may be made of epitaxially grown crystalline silicon.

In the aforementioned structure, the second noncrystalline silicon layer may contain not more than a prescribed quantity of hydrogen.

In the aforementioned structure, pyramidal irregularities may be formed on the surface of the crystalline silicon region, and the aperiodic corrugated shape may be formed on the surfaces of the pyramidal irregularities.

In the aforementioned structure, the photovoltaic device may be so formed that light is incident upon the crystalline silicon region at least from the side, having the aperiodic corrugated shape, closer to the second noncrystalline silicon layer.

In the aforementioned structure, the crystalline silicon region may include a single-crystalline silicon substrate.

In the aforementioned structure, the first noncrystalline silicon layer and the second noncrystalline silicon layer may be made of amorphous silicon.

In the aforementioned structure, the photovoltaic device may further comprise a first conductivity type third noncrystalline silicon layer opposed to the first noncrystalline silicon layer with respect to the crystalline silicon region and a substantially intrinsic fourth noncrystalline silicon layer arranged between the crystalline silicon region and the third noncrystalline silicon layer.

In the aforementioned structure, the third noncrystalline silicon layer and the fourth noncrystalline silicon layer may be made of amorphous silicon.

A method of manufacturing a photovoltaic device according to a second aspect of the present invention comprises steps of forming a first conductivity type crystalline silicon region provided with a plurality of terraces exposing (111) planes on the surfaces thereof and a step connecting adjacent terraces with each other, forming a substantially intrinsic first noncrystalline silicon layer on the crystalline silicon region and forming a second conductivity type second noncrystalline silicon layer on the first noncrystalline silicon layer, while the step of forming the first noncrystalline silicon layer includes a step of forming an aperiodic corrugated shape having a height of not more than 2 nm on the interface between the crystalline silicon region and the first noncrystalline silicon layer.

In the aforementioned structure, the crystalline silicon region may include a single-crystalline silicon substrate.

In the aforementioned structure, the step of forming the first noncrystalline silicon layer may include a step of forming an epitaxial layer having the aperiodic corrugated shape epitaxially grown on the single-crystalline silicon substrate and forming the first noncrystalline silicon layer on the epitaxial layer.

In the aforementioned structure, the step of forming the first noncrystalline silicon layer may include a step of forming the first noncrystalline silicon layer by plasma CVD.

In the aforementioned structure, the step of forming the first noncrystalline silicon layer may include a step of forming the first noncrystalline silicon layer by plasma CVD under the condition that a dilution ratio for silane gas with hydrogen gas is not more than 5 times.

In the aforementioned structure, an average plane of the interface, having the aperiodic corrugated shape, between the crystalline silicon region and the first noncrystalline silicon layer may be inclined by a prescribed angle from the (111) plane of the crystalline silicon region.

In the aforementioned structure, the average plane may be inclined by the prescribed angle from the (111) plane of the crystalline silicon region in a rotational direction from the surfaces of the terraces of the crystalline silicon region exposing the (111) planes toward the outer surface of the step.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is now described with reference to the drawings.

First, the structure of a photovoltaic device according to this embodiment is described with reference to FIGS. 1 and 2.

Figure 1:
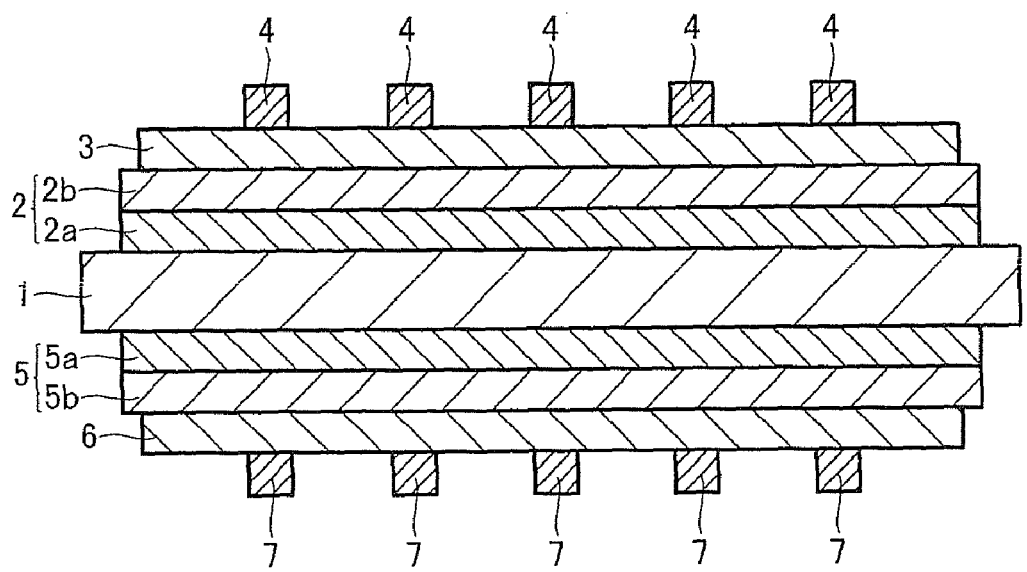
FIG. 1 is a sectional view showing the structure of a photovoltaic device according to an embodiment of the present invention.

In the photovoltaic device according to this embodiment, an amorphous silicon (a-Si) layer 2, a surface electrode 3 of ITO (indium tin oxide) having a thickness of about 70 nm to about 100 nm and collectors 4 of silver having a thickness of several 10 μm are successively formed on a first surface of an n-type single-crystalline silicon (c-Si) substrate 1, as shown in FIG. 1. The amorphous silicon layer 2 is constituted of a substantially intrinsic i-type amorphous silicon layer 2a, having a small thickness of about 9 nm to about 13 nm and containing not more than a prescribed quantity of hydrogen, formed on the upper surface of the n-type single-crystalline silicon substrate 1 and a p-type amorphous silicon layer 2b doped with boron (B), having a thickness of about 2 nm to about 5 nm and containing hydrogen, formed on the i-type amorphous silicon layer 2a. The i-type amorphous silicon layer 2a has a small thickness, not to substantially contribute to power generation. The n-type single-crystalline silicon substrate 1, the i-type amorphous silicon layer 2a and the p-type amorphous silicon layer 2b are examples of the "crystalline silicon region", the "second noncrystalline silicon layer" and the "first noncrystalline silicon layer" in the present invention respectively.

Figure 2:
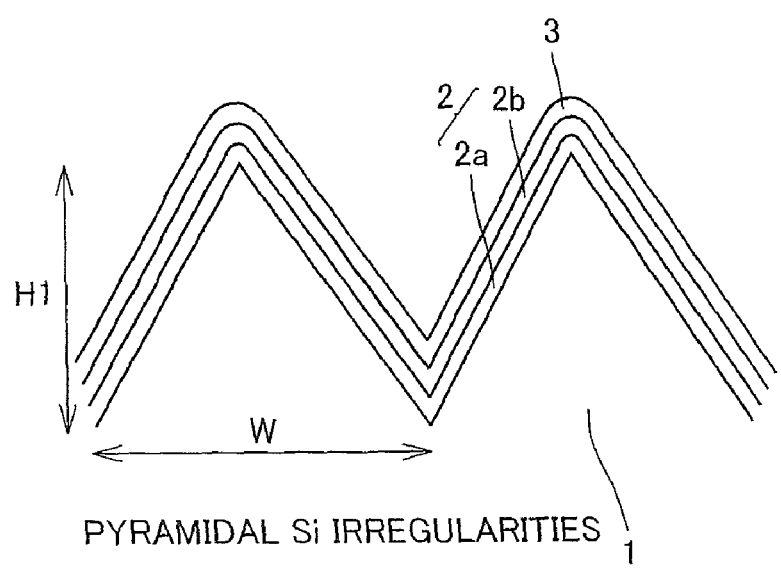
FIG. 2 is a sectional view showing the structure around an n-type single-crystalline silicon substrate shown in FIG. 1 in detail.

As shown in FIG. 2, relatively large pyramidal irregularities are formed on the first surface of the n-type single-crystalline silicon substrate 1, and the i-type amorphous silicon layer 2a, the p-type amorphous silicon layer 2b and the surface electrode 3 are formed on the first surface having these pyramidal irregularities. These pyramidal irregularities have a width W of several μm to several 10 μm and a height H1 of several μm to several 10 μm. (111) planes of silicon are exposed on the surfaces of these pyramidal irregularities. When light is incident upon the first surface, light reflectance on the first surface of the n-type single-crystalline silicon substrate 1 is reduced by a light confinement structure formed by the pyramidal irregularities, whereby a short-circuit current can be increased.

As shown in FIG. 1, an amorphous silicon layer 5, a surface electrode 6 of ITO having a thickness of about 70 nm to about 100 nm and collectors 7 of silver having a thickness of several 10 μm are formed on a second surface of the n-type single-crystalline silicon substrate 1 successively from the side closer to the second surface of the n-type single-crystalline silicon substrate 1. The amorphous silicon layer 5 is constituted of a substantially intrinsic i-type amorphous silicon layer 5a, having a small thickness of about 9 nm to about 13 nm, formed on the second surface of the n-type single-crystalline silicon substrate 1 and an n-type amorphous silicon layer 5b doped with phosphorus (P), having a thickness of about 10 nm to about 20 nm, formed on a second surface of the i-type amorphous silicon layer 5a. The i-type amorphous silicon layer 5a has a small thickness, not to substantially contribute to power generation. The i-type amorphous silicon layer 5a, the n-type amorphous silicon layer 5b and the surface electrode 6 constitute the so-called BSF (back surface field) structure. While the first surface of the n-type single-crystalline silicon substrate 1 is generally employed as a light incidence side in the photovoltaic device having such a structure, the second surface of the n-type single-crystalline silicon substrate 1 may alternatively be employed as a light incidence side.

A comparative experiment (Example and comparative examples 1 and 2) conducted for evaluating output characteristics of photovoltaic devices prepared in practice in relation to the aforementioned embodiment is now described with reference to FIGS. 1 to 4.

First, a manufacturing process for a photovoltaic device according to Example corresponding to the aforementioned embodiment is described.

Figure 3:
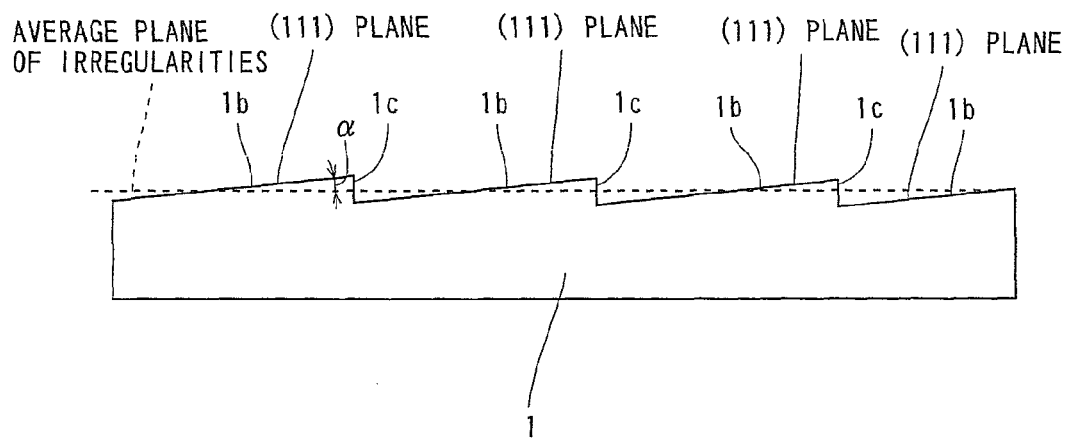
FIG. 3 is a sectional view showing the n-type single-crystalline silicon substrate in advance of formation of an i-type amorphous silicon layer.

First, a first surface of an n-type single-crystalline silicon substrate 1 having a (100) plane was anisotropically etched, thereby forming pyramidal irregularities resulting from (111) planes, as shown in FIG. 2. In this state, the first surface of the n-type single-crystalline silicon substrate 1 was provided with terraces 1b exposing the (111) planes of silicon and steps 1c coupling the adjacent terraces 1b with each other, as shown in FIG. 3. The surfaces of the terraces 1b and the steps 1c are hereinafter referred to as main surfaces and subsurfaces of the (111) planes respectively.

Thereafter layers were formed on the first surface and a second surface of the n-type single-crystalline silicon substrate 1 respectively under conditions shown in Table 1.

TABLE 1

| Treatment | | Substrate Temperature (° C.) | Forming Condition Working Gas (sccm) | Pressure (Pa) | Power Density (mW/cm2) |
|---|---|---|---|---|---|
| First Surface | i layer (a-Si:H) | 130-180 | $H_2$: 0-100 $SiH_4$: 40 | 40-120 | 5-15 |
| | p layer (a-Si:H) | 150-180 | $H_2$: 0-100 $SiH_4$: 40 $B_2H_6$ (2%): 40 | 40-120 | 5-15 |
| Second Surface | i layer (a-Si) | 170 | $SiH_4$: 40 | 40 | 8.33 |
| | n layer (a-Si:H) | 170 | $H_2$: 0-100 $SiH_4$: 40 $PH_3$ (1%): 40 | 40 | 8.33 |

Figure 4:
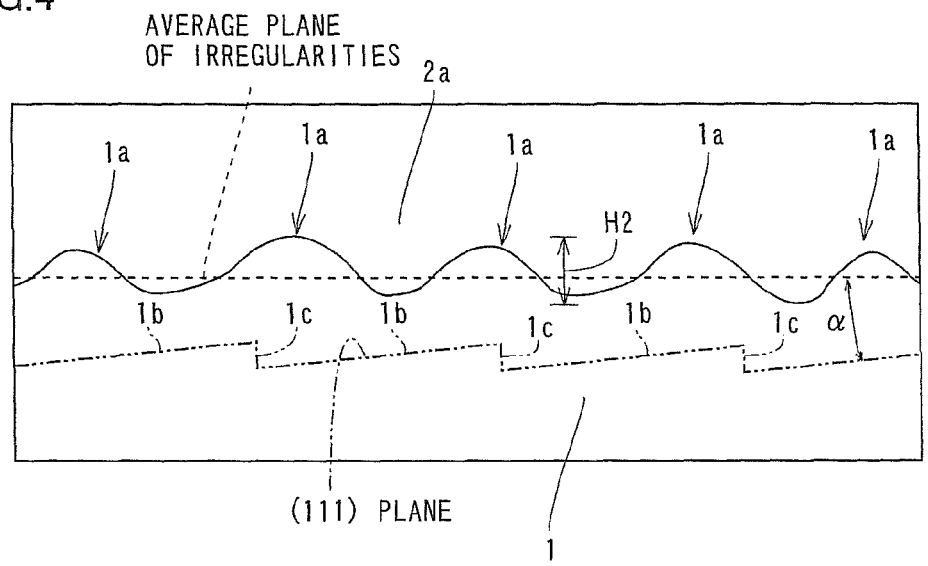
FIG. 4 is an enlarge sectional view showing the interface between the n-type single-crystalline silicon substrate and the i-type amorphous silicon layer in the photovoltaic device according to the embodiment.

More specifically, an i-type amorphous silicon layer 2a having a thickness of 10 nm was formed on the first surface of the n-type single-crystalline silicon substrate 1 by RF plasma CVD under conditions of a substrate temperature of 130° C. to 180° C., a hydrogen ($H_2$) gas flow rate of 0 sccm to 100 sccm, a silane ($SiH_4$) gas flow rate of 40 sccm, a pressure of 40 Pa to 120 Pa and an RF power density of 5 mW/cm$^2$ to 15 mW/cm$^2$. At this time, the flow rate of the working gas ($H_2$) was controlled in the range of 0 sccm to 100 sccm so that a dilution ratio for the silane ($SiH_4$) gas with the hydrogen gas was not more than 5 times. Thus, an epitaxial layer 1a was formed from starting points of the steps 1c shown in FIG. 3, and the i-type amorphous silicon layer 2a was formed on the epitaxial layer 1a. The epitaxial layer 1a was stacked on an average plane (first surface of the n-type single-crystalline silicon substrate 1) of the steps 1c and the terraces 1b, whereby an average plane of an aperiodic corrugated shape portion of the epitaxial layer 1a was inclined by a prescribed angle with respect to the (111) planes of silicon exposed on the terraces 1b. Thus, the aperiodic corrugated shape portion was formed on the interface between the n-type single-crystalline silicon substrate 1 and the i-type amorphous silicon layer 2a, and the i-type amorphous silicon layer 2a was formed on the corrugated shape portion, as shown in FIG. 4.

Then, a p-type amorphous silicon layer 2b doped with boron (B) having a thickness of 6 nm was formed on the i-type amorphous silicon layer 2a by RF plasma CVD under conditions of a substrate temperature of 150° C. to 180° C., a hydrogen ($H_2$) gas flow rate of 0 sccm to 100 sccm, a silane ($SiH_4$) gas flow rate of 40 sccm, a diborane ($B_2H_6$)/$H_2$ (concentration of $B_2H_6$ gas with respect to $H_2$: 2%) gas flow rate of 40 sccm, a pressure of 40 Pa to 120 Pa and an RF power density of 5 mW/cm$^2$ to 15 mW/cm$^2$, as shown in Table 1.

Then, an i-type amorphous silicon layer 5a having a thickness of 10 nm was formed on the second surface of the n-type single-crystalline silicon substrate 1 by RF plasma CVD under conditions of a substrate temperature of 170° C., a silane ($SiH_4$) gas flow rate of 40 sccm, a pressure of 40 Pa and an RF power density of 8.33 mW/cm$^2$, as shown in Table 1.

Then, an n-type amorphous silicon layer 5b doped with phosphorus (P) having a thickness of 15 nm was formed on a second surface of the i-type amorphous silicon layer 5a by RF plasma CVD under conditions of a substrate temperature of 170° C., a hydrogen ($H_2$) gas flow rate of 0 sccm to 100 sccm, a silane ($SiH_4$) gas flow rate of 40 sccm, a phosphine ($PH_3$)/$H_2$ (concentration of $PH_3$ with respect to $H_2$: 1%) gas flow rate of 40 sccm, a pressure of 40 Pa and an RF power density of 8.33 mW/cm$^2$, as shown in Table 1.

Finally, surface electrodes 3 and 6 of ITO having a thickness of 85 nm were formed on the surfaces of the p-type amorphous silicon layer 2b and the n-type amorphous silicon layer 5b by sputtering respectively, and collectors 4 and 7 of silver having a thickness of several 10 μm were formed on prescribed regions of the surface electrodes 3 and 6 respectively. Thus, the photovoltaic device according to Example was formed.

A photovoltaic device according to comparative example 1 corresponding to exemplary prior art was formed while keeping an $H_2$ gas flow rate at a relatively high constant level close to 100 sccm so that a dilution ratio for a silane ($SiH_4$) gas with the hydrogen gas was larger than 5 times as a condition for forming an i-type amorphous silicon layer. A photovoltaic device according to comparative example 2 corresponding to another exemplary prior art was formed while keeping an $H_2$ gas flow rate at a relatively low constant level close to 0 sccm as a condition for forming an i-type amorphous silicon layer. The remaining manufacturing processes for the photovoltaic devices according to comparative examples 1 and 2 are similar to those of the photovoltaic device according to the aforementioned Example.

In the photovoltaic device according to Example, an aperiodic small corrugated shape was formed on the interface between the n-type single-crystalline silicon substrate 1 and the i-type amorphous silicon layer 2a, as shown in FIG. 4. Further, the corrugated shape portion (epitaxial layer 1a) in the vicinity of the interface between the n-type single-crystalline silicon substrate 1 and the i-type amorphous silicon layer 2a was formed by epitaxial growth when the i-type amorphous silicon layer 2a was formed. The height H2 of small irregularities of the epitaxial layer 1 was smaller than 1 nm.

Further, the average plane of the interface, having the aperiodic corrugated shape, between the n-type single-crystalline silicon substrate 1 and the i-type amorphous silicon layer 2a was inclined by a prescribed angle α (about 3±1°) in a rotational direction from the main surfaces of (111) planes of the n-type single-crystalline silicon substrate 1 (surfaces of terraces 1b exposing the (111) planes) toward subsurfaces (outer surfaces of steps 1c), as shown in FIG. 4.

In the photovoltaic device according to comparative example 1, epitaxial growth was prompted due to the aforementioned condition, whereby an epitaxially grown portion (epitaxial layer) including an aperiodic corrugated shape exhibited a height exceeding 2 nm. In the photovoltaic device according to comparative example 2, on the other hand, no aperiodic corrugated shape portion was epitaxially grown on the interface between an n-type single-crystalline silicon substrate and an i-type amorphous silicon layer but the i-type amorphous silicon layer was directly formed on the n-type single-crystalline silicon substrate having terraces 1b and steps 1c similar to those shown in FIG. 3.

Then, the output characteristics of the photovoltaic devices according to Example and comparative examples 1 and 2 prepared in the aforementioned manner were measured. Measured data are Voc (open-circuit voltage), Isc (short-circuit current), F.F. (fill factor) and Pmax (cell output). Table 2 shows the results of the measurements.

TABLE 2

|  | Voc (V) | Isc (A) | F.F | Pmax (W) |
|---|---|---|---|---|
| Example | 0.725 | 3.850 | 0.769 | 2.147 |
| Comparative Example 1 | 0.680 | 3.820 | 0.752 | 1.953 |
| Comparative Example 2 | 0.709 | 3.880 | 0.762 | 2.096 |

As shown in Table 2, the output characteristic was improved in the photovoltaic device according to comparative example 2 provided with no epitaxial layer, as compared with the photovoltaic device according to comparative example 1 provided with the epitaxial layer having the height larger than 2 nm between the n-type single-crystalline silicon substrate and the i-type amorphous silicon layer. More specifically, the open-circuit voltages Voc of the photovoltaic devices according to comparative examples 1 and 2 were 0.680 V and 0.709 V respectively. This is conceivably for the following reason: The photovoltaic device according to comparative example 1 was provided with the epitaxial layer having the height larger than 2 nm, whereby the characteristic on the interface between the n-type single-crystalline silicon substrate and the i-type amorphous silicon layer was deteriorated as compared with the photovoltaic device according to comparative example 2 provided with no epitaxial layer. The open-circuit voltage Voc in the photovoltaic device according to comparative example 1 was conceivably reduced as compared with the photovoltaic device according to comparative example 2 due to the deterioration of the interfacial characteristic.

It has been proved that the output characteristic of the photovoltaic device according to Example provided with the epitaxial layer 1a having the height smaller than 1 nm was further improved as compared with the photovoltaic device according to comparative example 2. More specifically, the open-circuit voltages Voc of the photovoltaic devices according to comparative example 2 and Example were 0.709 V and 0.725 V respectively.

The short-circuit current Isc of the photovoltaic device according to comparative example 2 was larger than that of the photovoltaic device according to comparative example 1. Further, the short-circuit current Isc of the photovoltaic device according to Example was larger than that of the photovoltaic device according to comparative example 1, and smaller than that of the photovoltaic device according to comparative example 2. More specifically, the short-circuit currents Isc of the photovoltaic devices according to comparative examples 1 and 2 and Example were 3.820 A, 3.880 A and 3.850 A respectively. In other words, it is understood that the short-circuit current is increased as the height of the epitaxial layer is reduced.

It has been proved that the fill factor F.F. of the photovoltaic device according to comparative example 2 was larger than that of the photovoltaic device according to comparative example 1, and the fill factor F.F. of the photovoltaic device according to Example was larger than that of the photovoltaic device according to comparative example 2. More specifically, the fill factors F.F. of the photovoltaic devices according to comparative examples 1 and 2 and Example were 0.752, 0.762 and 0.769 respectively.

It has been proved that the cell output Pmax of the photovoltaic device according to comparative example 2 was larger than that of the photovoltaic device according to comparative example 1, and the cell output Pmax of the photovoltaic device according to Example was larger than that of the photovoltaic device according to comparative example 2. More specifically, the cell outputs Pmax of the photovoltaic devices according to comparative examples 1 and 2 and Example were 1.953 W, 2.096 W and 2.147 W respectively. Thus, the cell output Pmax of the photovoltaic device according to Example was remarkably improved as compared with the photovoltaic devices according to comparative examples 1 and 2.

According to each of the aforementioned embodiment and Example, as hereinabove described, the aperiodic corrugated shape having the height smaller than 1 nm is so formed on the interface between the n-type single-crystalline silicon substrate 1 and the i-type amorphous silicon layer 2a that the characteristics of the photovoltaic device can be improved as compared with the case where the height of the aperiodic corrugated shape is larger than 2 nm and the case where no aperiodic corrugated shape is formed.

Although the present invention has been described and illustrated in detail, it is clearly understood that the same is by way of illustration and example only and is not to be taken by way of limitation, the spirit and scope of the present invention being limited only by the terms of the appended claims.

For example, while the p-type amorphous silicon layer 2b is formed on the first surface of the n-type single-crystalline silicon substrate 1 through the substantially intrinsic i-type amorphous silicon layer 2a in each of the aforementioned embodiment and Example, the present invention is not restricted to this but an n-type amorphous silicon layer may alternatively be formed on a first surface of a p-type single-crystalline silicon substrate through a substantially intrinsic i-type amorphous silicon layer. In this case, the p-type amorphous silicon layer may be formed on a second surface of the p-type single-crystalline silicon substrate through the substantially intrinsic i-type amorphous silicon layer.

While the height of the aperiodic corrugated shape of the epitaxial layer 1a is smaller than 1 nm in the aforementioned Example, the present invention is not restricted to this but the height of the aperiodic corrugated shape may alternatively be not more than 2 nm. When the height of the aperiodic corrugated shape is not more than 2 nm, the output characteristic of the photovoltaic device can be improved similarly to the aforementioned Example.

While the amorphous silicon layer 2 (the i-type amorphous silicon layer 2a and the p-type amorphous silicon layer 2b) is formed by RF plasma CVD in each of the aforementioned embodiment and Example, the present invention is not restricted to this but the amorphous silicon layer 2 may alternatively be formed by another thin film forming method such as ECR (electron cyclotron resonance) plasma CVD, Cat-CVD (catalytic chemical vapor deposition) or sputtering.

While the amorphous silicon layer 5 (the i-type amorphous silicon layer 5a and the n-type amorphous silicon layer 5b) is formed on the second surface of the n-type single-crystalline silicon substrate 1 in the BSF structure in each of the aforementioned embodiment and Example, the present invention is not restricted to this but the surface electrode 6 may alternatively be formed on the second surface of the n-type single-crystalline silicon substrate 1 without forming the n-side (back-side) amorphous silicon layer 5.

While the average plane of the interface, having the aperiodic corrugated shape, between the n-type single-crystalline silicon substrate 1 and the i-type amorphous silicon layer 2a is inclined by the prescribed angle α (about 3±1°) in the rotational direction from the main surfaces of the (111) planes of the n-type single-crystalline silicon substrate 1 toward the subsurfaces in each of the aforementioned embodiment and Example, the present invention is not restricted to this but the average plane may alternatively be inclined by an angle other than the prescribed angle α (about 3±1°).

While the aperiodic corrugated shape is formed on the interface between the n-type single-crystalline silicon substrate 1 and the i-type amorphous silicon layer 2a in each of the aforementioned embodiment and Example, the present invention is not restricted to this but the aperiodic corrugated shape may alternatively be formed on the interface between the n-type single-crystalline silicon substrate 1 and the i-type amorphous silicon layer 5a.

What is claimed is:

1. A photovoltaic device comprising:
   a first conductivity type crystalline silicon region;
   a second conductivity type first noncrystalline silicon layer; and
   a substantially intrinsic second noncrystalline silicon layer arranged between said crystalline silicon region and said first noncrystalline silicon layer, wherein
   said crystalline silicon region has a smooth aperiodic corrugated shape having a height of not more than 2 nm on the interface between said crystalline silicon region and said second noncrystalline silicon layer.

2. The photovoltaic device according to claim 1, wherein said aperiodic corrugated shape of said crystalline silicon region has a height of not more than 1 nm.

3. The photovoltaic device according to claim 1, wherein an average plane of the interface between said crystalline silicon region having said aperiodic corrugated shape and said second noncrystalline silicon layer is inclined by a prescribed angle from the (111) plane of said crystalline silicon region.

4. The photovoltaic device according to claim 3, wherein said average plane is inclined by 3±1° from the (111) plane of said crystalline silicon region.

5. The photovoltaic device according to claim 3, wherein said crystalline silicon region includes:
   a crystalline silicon substrate provided with a plurality of terraces exposing (111) planes on the surfaces thereof and a step connecting adjacent said terraces with each other, and
   an epitaxial layer epitaxially grown on said crystalline silicon substrate, and
   said average plane is inclined by said prescribed angle from the (111) plane of said crystalline silicon region in a rotational direction from the surfaces of said terraces of said crystalline silicon substrate exposing the (111) planes toward the outer surface of said step.

6. The photovoltaic device according to claim 1, wherein a portion of said crystalline silicon region close to the interface between said crystalline silicon region and said second noncrystalline silicon layer is made of epitaxially grown crystalline silicon.

7. The photovoltaic device according to claim 1, wherein said second noncrystalline silicon layer contains not more than a prescribed quantity of hydrogen.

8. The photovoltaic device according to claim 1, wherein pyramidal irregularities are formed on the surface of said crystalline silicon region, and said aperiodic corrugated shape is formed on the surfaces of said pyramidal irregularities.

9. The photovoltaic device according to claim 1, so formed that light is incident upon said crystalline silicon region at least from the side, having said aperiodic corrugated shape, closer to said second noncrystalline silicon layer.

10. The photovoltaic device according to claim 1, wherein said crystalline silicon region includes a single-crystalline silicon substrate.

11. The photovoltaic device according to claim 1, wherein said first noncrystalline silicon layer and said second noncrystalline silicon layer are made of amorphous silicon.

12. The photovoltaic device according to claim 1, further comprising:
    a first conductivity type third noncrystalline silicon layer opposed to said first noncrystalline silicon layer with respect to said crystalline silicon region, and
    a substantially intrinsic fourth noncrystalline silicon layer arranged between said crystalline silicon region and said third noncrystalline silicon layer.

13. The photovoltaic device according to claim 12, wherein said third noncrystalline silicon layer and said fourth noncrystalline silicon layer are made of amorphous silicon.

14. A method of manufacturing a photovoltaic device, comprising steps of:
    forming a first conductivity type crystalline silicon region provided with a plurality of terraces exposing (111) planes on the surfaces thereof and a step connecting adjacent said terraces with each other;
    forming a substantially intrinsic first noncrystalline silicon layer on said crystalline silicon region; and
    forming a second conductivity type second noncrystalline silicon layer on said first noncrystalline silicon layer, wherein
    said step of forming said first noncrystalline silicon layer includes a step of forming a smooth aperiodic corrugated shape having a height of not more than 2 nm on the interface between said crystalline silicon region and said first noncrystalline silicon layer.

15. The method of manufacturing a photovoltaic device according to claim 14, wherein
    said crystalline silicon region includes a single-crystalline silicon substrate.

16. The method of manufacturing a photovoltaic device according to claim 15, wherein
    said step of forming said first noncrystalline silicon layer includes a step of forming an epitaxial layer having said aperiodic corrugated shape epitaxially grown on said single-crystalline silicon substrate and forming said first noncrystalline silicon layer on said epitaxial layer.

17. The method of manufacturing a photovoltaic device according to claim 14, wherein
    said step of forming said first noncrystalline silicon layer includes a step of forming said first noncrystalline silicon layer by plasma CVD.

18. The method of manufacturing a photovoltaic device according to claim 17, wherein
    said step of forming said first noncrystalline silicon layer includes a step of forming said first noncrystalline silicon layer by plasma CVD under the condition that a dilution ratio for silane gas with hydrogen gas is not more than 5 times.

19. The method of manufacturing a photovoltaic device according to claim 14, wherein
an average plane of the interface, having said aperiodic corrugated shape, between said crystalline silicon region and said first noncrystalline silicon layer is inclined by a prescribed angle from the (111) plane of said crystalline silicon region.

20. The method of manufacturing a photovoltaic device according to claim 19, wherein
said average plane is inclined by said prescribed angle from the (111) plane of said crystalline silicon region in a rotational direction from the surfaces of said terraces of said crystalline silicon region exposing the (111) planes toward the outer surface of said step.

* * * * *